(12) United States Patent
Hunter et al.

(10) Patent No.: US 6,683,298 B1072803
(45) Date of Patent: Jan. 27, 2004

(54) IMAGE SENSOR PACKAGING WITH PACKAGE CAVITY SEALED BY THE IMAGING OPTICS

(75) Inventors: Andrew Arthur Hunter, Bristol (GB); Ray Schuder, Menlo Park, CA (US); Park-Kee Yu, San Jose, CA (US); James-Yu Chang, Cupertino, CA (US)

(73) Assignee: Agilent Technologies Inc., Santa Clara, CA (US)

( * ) Notice: Subject to any disclaimer, the term of this patent is extended or adjusted under 35 U.S.C. 154(b) by 88 days.

(21) Appl. No.: 09/717,185

(22) Filed: Nov. 20, 2000

(51) Int. Cl.[7] .................................................. H01J 5/02
(52) U.S. Cl. ..................... 250/239; 250/208.1
(58) Field of Search .............................. 250/239, 208.1, 250/216; 257/80, 84, 431, 435, 290, 291; 348/294, 290, 340

(56) References Cited

U.S. PATENT DOCUMENTS

| | | | |
|---|---|---|---|
| 5,400,072 A | | 3/1995 | Izumi et al. |
| 5,424,531 A | | 6/1995 | O'Regan et al. |
| 5,526,952 A | * | 6/1996 | Green ........................ 220/3.8 |
| 5,764,424 A | * | 6/1998 | Jaeger et al. ................ 359/702 |
| 5,811,799 A | * | 9/1998 | Wu .............................. 250/239 |
| 5,998,878 A | * | 12/1999 | Johnson ........................ 257/797 |
| 6,075,237 A | * | 6/2000 | Ciccarelli ................. 250/208.1 |
| 6,130,448 A | * | 10/2000 | Bauer et al. ................. 257/222 |
| 6,191,395 B1 | * | 2/2001 | Sengupla et al. ........... 174/52.3 |
| 6,220,251 B1 | * | 4/2001 | Jeong et al. ................. 132/73.5 |
| 6,266,197 B1 | * | 7/2001 | Glenn et al. .................. 359/819 |
| 6,384,397 B1 | * | 5/2002 | Takiar et al. ............. 250/208.1 |
| 6,396,116 B1 | * | 5/2002 | Kelly et al. .................. 257/432 |
| 6,414,299 B1 | * | 7/2002 | Churei ..................... 250/214.1 |

* cited by examiner

*Primary Examiner*—David V. Bruce
*Assistant Examiner*—Irakli Kiknadze

(57) ABSTRACT

A digital image capture system includes an image sensor package and a powered lens element that is attached to the image sensor package. The image sensor package includes an image sensor, a package structure for holding the image sensor, and electrical connectors for creating electrical connection between the image sensor and a circuit board. The package structure and the powered lens element include complementary surfaces that enable the powered lens element to be attached to the image sensor package. Preferably, the powered lens element is glued to the package structure to create a sealed environment for the image sensor. In an embodiment, a temporary protective cover is attached to the powered lens element to protect the powered lens element during attachment of the image sensor package to the circuit board. In an embodiment of the digital image capture system, an additional powered lens element is attached to the powered lens element to create a composite lens element. In an embodiment of the digital image capture system, the powered lens element includes an opaque surface that prevents unwanted light from contacting the image sensor. An advantage of the digital image capture system is that no additional lens mounting structures are required to attach a powered lens element to the image sensor package.

20 Claims, 2 Drawing Sheets

IMAGE SENSOR PACKAGING WITH PACKAGE CAVITY SEALED BY THE IMAGING OPTICS

FIELD OF THE INVENTION

The invention relates generally to digital image capture systems, and more particularly to the packaging of image sensors in conjunction with imaging optics.

BACKGROUND OF THE INVENTION

Digital image capture systems utilize image sensors to capture digital image information. As with conventional film based image capture systems, digital image capture systems utilize imaging optics and an aperture to direct light onto the image capture medium. Many new high volume applications of digital image capture systems require image sensors and imaging optics that are small and easy to assemble.

In order to ensure the quality of images generated from a digital image capture system, it is important that only a controlled amount of light is able to contact the image sensor. In order to control the amount of light that contacts the image sensor, the image sensor is sealed in a light-tight environment with image bearing light passing through a lens aperture. Light contacting the image sensor from any other location will degrade the quality of the captured images.

In order to make digital image capture systems that are easy to assemble, it is important that the image sensor chips can be packaged with standard packaging techniques, such as wire bonding, and that the image sensor packages can be attached to circuit boards utilizing standard automated mounting techniques, such as widely utilized surface mounting techniques.

It is also important in digital image capture systems that the imaging optics be accurately aligned with the image sensor so that the image bearing light is focused onto the image sensor. One technique for accurately aligning the imaging optics with the image sensor involves powering up the image sensor and adjusting the location of the imaging optics in response to a detected image. Powering up the image sensor to align the imaging optics is time consuming and requires specialized alignment equipment.

Various techniques are known for integrating imaging optics with an image sensor. One prior art digital image capture system involves a lens system that is attached directly to the surface of an image sensor. FIG. 1 is an example depiction of a digital image capture system in which a lens system is attached directly to the surface of an image sensor. The digital image capture system includes a printed circuit board 104, an image sensor package 102, an image sensor chip 110, wire bonds 106, package leads 112, a lens system 120 and 124, a lens aperture 122, and an opaque encapsulant 126. As shown in FIG. 1, the lens system is attached directly to the surface of the image sensor and the opaque encapsulant is utilized to fill in the space between the lens system and the image sensor package. Alternatively, the lens system may be aligned by contact with the image sensor but not attached directly to the image sensor. The arrangement of image capture elements works well to prevent unwanted light from contacting the image sensor and can provide accurate alignment between the image sensor and the lens system. Although the image capture system can prevent unwanted light from contacting the image sensor and provide accurate alignment between the image sensor and the lens system, the arrangement of image capture elements is not well suited to high-volume assembly processes, such as wire boding, because the lens system hinders the wire bonding process or may damage existing wire bonds during placement of the lens system.

Another prior art digital image capture system involves attaching an image sensor package to a circuit board and then attaching an imaging optics system directly to the same circuit board around the outer edges of the image sensor package. FIG. 2 is an example depiction of a digital image capture system in which imaging optics and an image sensor package are attached to the same circuit board. The digital image capture system includes a circuit board 204, an image sensor package 202, an image sensor chip 210, wire bonds 206, connection leads 212, an image sensor cover glass 214, a light shield 226, an infra-red filter 224, a filter retaining ring 228, a lens attachment structure 230, lens attachment screws 232, a lens holder 218, lens elements 220, and a lens aperture 222. Although the arrangement of image capture elements works well, the technique requires many additional parts which add cost to the overall image capture system. In addition, the circuit board must be designed and built with precisely aligned attachment holes for attaching the imaging optics. Even with precisely aligned holes for attaching the imaging optics, the image sensor package must be mounted on the circuit board with precise accuracy in order to ensure alignment between the imaging optics and the image sensor. Further, the attachment structure of the imaging optics extends beyond the outer edges of the image sensor package, thereby taking up valuable circuit board real estate. Another disadvantage of the image capture structure is that it is difficult to get the rear lens element close to the image sensor because the image sensor cover glass is in the way.

The description of prior art image capture systems is not meant to be exhaustive although it does highlight some of the problems involved with assembling image capture systems, such as high volume digital cameras, that utilize image sensor chips and imaging optics. In view of the problems involved with assembling image capture systems, what is needed is an economic and reliable technique for assembling a digital image capture system.

SUMMARY OF THE INVENTION

A digital image capture system includes an image sensor package and a powered lens element that is attached to the image sensor package. The image sensor package includes an image sensor, a package structure for holding the image sensor, and electrical connectors for creating electrical connection between the image sensor and a circuit board. The package structure and the powered lens element include complementary surfaces that enable the powered lens element to be attached to the image sensor package.

Preferably, the powered lens element is glued to the package structure to create a sealed environment for the image sensor. In an embodiment, a temporary protective cover is attached to the powered lens element to protect the powered lens element during attachment of the image sensor package to the circuit board.

In an embodiment of the digital image capture system, an additional powered lens element is attached to the first powered lens element to create a composite lens element.

In an embodiment of the digital image capture system, the powered lens element includes an opaque surface that prevents unwanted light from contacting the image sensor. The powered lens element also includes a light input and a light output that enable light traveling in desired paths to pass through the powered lens element and contact the image sensor.

In an embodiment of the digital image capture system, an optically powered portion of the powered lens element is located on the rear surface of the powered lens element near the image sensor.

In an embodiment of the digital image capture system, the package structure includes alignment features for aligning the powered lens element with the package structure.

An advantage of the digital image capture system is that no additional lens mounting structures are required to attach a powered lens element to the image sensor package. Another advantage is that the lens element can be located close to the image sensor because the lens element takes the place of the rear cover glass. In addition, the digital image capture system is compatible with known chip packaging and surface mounting techniques that are utilized for high-volume electronic devices.

Another digital image capture system includes an image sensor package, an unpowered transparent cover element attached to the image sensor package, and a powered lens element attached to the unpowered transparent cover element. The image sensor package includes an image sensor, a package structure for holding the image sensor, and electrical connectors for creating electrical connection between the image sensor and a circuit board. The package structure and the unpowered transparent cover element include complementary surfaces that enable the unpowered transparent cover element to be attached to the image sensor package.

Preferably, the unpowered transparent cover element is glued to the package structure to create a sealed environment for the image sensor and the powered lens element is glued to the unpowered transparent cover element. The powered lens element can be glued to the unpowered transparent cover element after the image sensor package is soldered to the circuit board. In an embodiment, a temporary protective cover is attached to the unpowered transparent cover element or the powered lens element to protect the unpowered transparent cover element or the powered lens element during attachment of the image sensor package to the circuit board.

An advantage of the digital image capture system is that the image sensor package can be mounted to the circuit board before the powered lens element is attached to the unpowered transparent cover element, thereby preventing the powered lens element from being exposed to the high temperatures of circuit board assembly.

Another digital image capture system includes an image sensor, a package structure for holding the image sensor, and electrical connectors for creating electrical connections between the image sensor and a circuit board. The package structure includes a surface that is complementary to a surface of a temporary protective cover and a surface of a powered lens element. The surface of the package structure allows a temporary protective cover and then a powered lens element to be attached to the package structure. In an embodiment, the temporary protective cover is attached to the package structure while the electrical connectors are attached to the circuit board. The temporary protective cover is then replaced by the powered lens element after the electrical connectors are attached to the circuit board. An advantage of the digital image capture system is that the image sensor package can be mounted to the circuit board while the image sensor is protected by the temporary protective cover instead of the powered lens element, thereby preventing the powered lens element from being exposed to the high temperatures of circuit board assembly.

DETAILED DESCRIPTION

Figure 1:
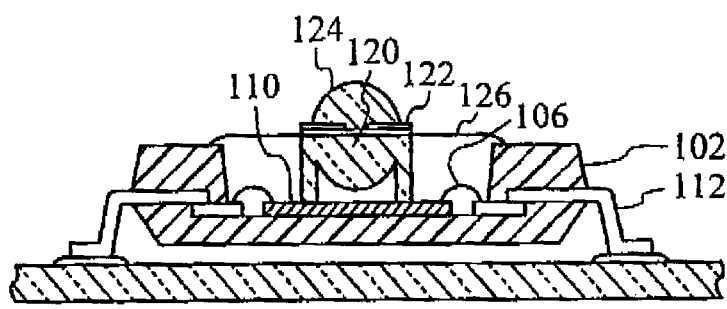
FIG. 1 is an example depiction of a prior art digital image capture system in which a lens element is attached directly to the surface of an image sensor.
Figure 2:
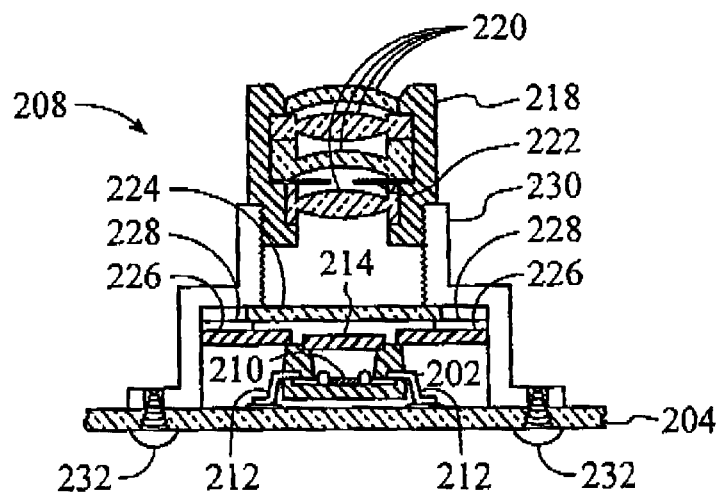
FIG. 2 is an example depiction of a prior art digital image capture system in which imaging optics are attached to the same circuit board as an image sensor package.
Figure 3:
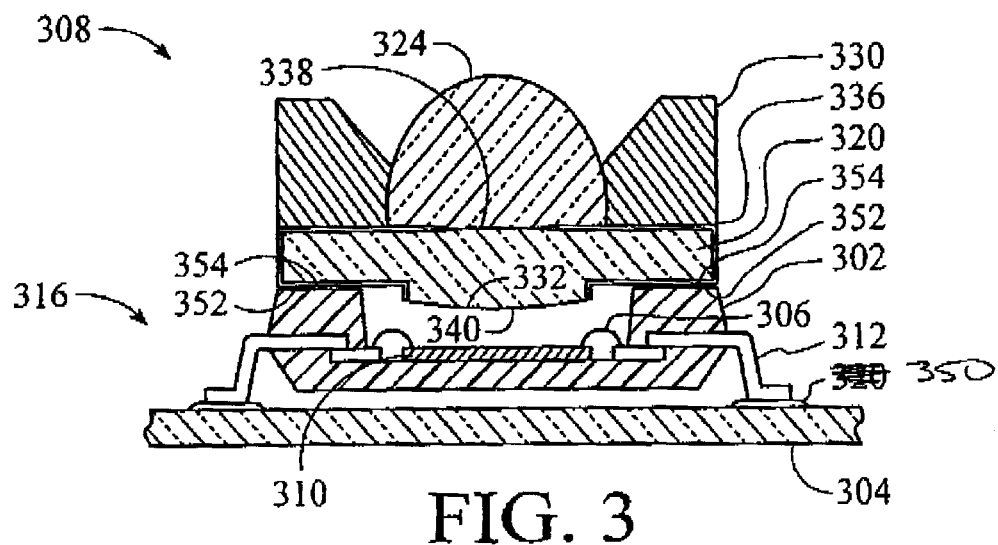
FIG. 3 is a depiction of an image capture system in which a powered lens element is attached to the package structure of a surface mounted image sensor package in accordance with an embodiment of the invention.

FIG. 3 is a depiction of a digital image capture system in which a powered lens element is directly connected to a surface mounted image sensor package. The image capture system includes a circuit board 304, an image sensor package 316, and an optics system 308. Each of the elements and respective sub-elements are described in detail below.

The circuit board 304 includes a conventional circuit board that is utilized in image capture applications such as hand-held digital cameras. In an embodiment, electronic components, such as image sensor packages, are connected to electrical contact points 350 on the circuit board utilizing known surface mounting techniques. Typically, the electronic components are attached with automated soldering processes that subject the circuit board and components to temperatures that are too high for many plastic optical lens components.

The image sensor package 316 includes a package structure 302, an image sensor 310, wire bonds 306, and connection leads 312. The image sensor, wire bonds, and connection leads include elements that are known in the field of digital image capture systems.

The package structure 302 houses the image sensor 310 in a package cavity and supports the connection leads 312 that electrically connect the image sensor to the circuit board 304. The package structure prevents some unwanted light from reaching the image sensor and allows image bearing light to reach the image sensor through the top of the package cavity. The package structure may be made of known packaging materials such as plastic or ceramic.

The package structure 302 is designed to create a light-tight connection between the package structure and a powered lens element of the optics system 308. In order to create a light-tight connection between the package structure and the powered lens element, and in accordance with an embodiment of the invention, the package structure includes a surface 352 that is complementary to a surface of the powered lens element. That is, the surface of the package structure fits adjacent to an opposite surface of the powered lens element to create a light-tight seal around the entire package structure. In an embodiment, the surface includes a continuous surface around the package structure that is complimentary to a continuous surface of the powered lens element. Preferably, the adjacent surfaces of the package structure and the powered lens element are glued together to create a sealed environment for the image sensor. In an embodiment, the surface of the package structure may include seals or irregularities that help to ensure a secure connection between the image sensor package 316 and the powered lens element. More than one contact surface may exist on the package structure. Preferably, the package structure cavity and contact surface are designed to minimize the radius of the powered lens element that is necessary to span the package structure cavity.

The optics system 308 includes, at a minimum, the powered lens element 320 that is attached to the package structure 302. The optics system may also include additional powered or non-powered lens elements and/or a lens hood 330. In the embodiment of FIG. 3, the lens element that is attached to the package structure is referred to as the rear lens element 320 and the lens element 324 that is attached to the rear lens element is referred to as the front lens element. The combination of the two lens elements is referred to as a composite lens element. The optics system may include adjustable optical elements that allow focusing and adjusting the field-of-view. The optics system may include multiple lens elements and/or an optical filter such as an infrared filter.

In the embodiment of FIG. 3, the rear lens element 320 includes a surface 354, an optically powered portion 332, an opaque surface coating 336, a light input 338, and a light output 340. The rear lens element may be made of, for example, glass or plastic, however glass is preferred because it can withstand the high temperatures involved with printed circuit board assembly. The attachment surface 354 of the rear lens element is a surface that is complementary to the attachment surface 352 of the package structure. The surface of the rear lens element is preferably glued to the surface 352 of the package structure 302 to create a sealed and secure connection between the package structure and the lens element. In an embodiment, the surface of the lens element includes a continuous surface that fits directly against the opposite surface of the package structure. In an embodiment, the surface of the lens element may include complementary seals or irregularities that ensure a secure connection between the image sensor package and the lens element. More than one complementary surface may exist on the lens element.

The optically powered portion 332 of the rear lens element 320 (also referred to as the powered lens element) directs and focuses the desired image bearing light onto the image sensor 310. In the embodiment of FIG. 3, the optically powered portion of the rear lens element is a curved portion of the lens that is located on the bottom surface of the lens element. Locating the optically powered portion of the lens element on the bottom surface enables the optically powered portion of the lens element to be close to the image sensor. Although the lens element is depicted with a single optically powered portion (singlet), the lens element may have multiple optically powered portions. The optically powered portion of the lens element may be part of a monolithic lens element, or alternatively the optically powered portion of the lens element may be glued or welded to a transparent element that covers the package cavity as is described in more detail below. Further, additional powered lens elements may be tightly coupled to the rear lens element to create a composite lens element. An additional lens, or lenses, may be stacked on top of the rear lens element, either supported on the perimeter of the rear lens element or by the package structure.

Additional lens elements can be added to the rear lens element after the image sensor package is attached to the circuit board in order to prevent exposure to the high temperatures involved with printed circuit board assembly. Adding additional lens elements at a later time also enables the optical properties of the lens system to be chosen after the image sensor has been packaged and/or purchased for use in a specific product.

The opaque surface coating 336 on the rear lens element 320 blocks undesired light from contacting the image sensor 310. In an embodiment, the opaque surface coating is applied to the rear lens element on all surface areas except the light input 338 and the light output 340. Although an opaque surface coating is described, other techniques may be utilized to prevent unwanted light from contacting the image sensor.

The light input 338 is the region where the desired, or image bearing, light enters the rear lens element 320. The light input may be formed by a void in the opaque surface coating 336 that is applied to prevent unwanted light from contacting the image sensor 310. The light input is located at the front surface of the rear lens element. In an embodiment, the light input may also act as an aperture that is adjusted to control the amount of light that contacts the image sensor. In an embodiment, the light input region acts as a baffle to cut down the passage of stray light and a lens aperture is located on top of the input region.

The light output 340 is the region where the desired, or image bearing, light exits the rear lens element 320. The light output may be formed by a void in the opaque surface coating of the lens element. The light output is located near the rear surface of the lens element, nearest to the image sensor 310. In the embodiment of FIG. 3, the light output is aligned with the optically powered portion 332 of the lens element such that light exits the lens element only through the optically powered portion.

The rear lens element 320 may be attached to the package structure 302 utilizing known techniques such as gluing, screwing, and welding. In an embodiment, the surface 354 of the rear lens element is glued to the surface 352 of the package structure and support for the lens element is provided entirely by the package structure. The attachment technique preferably creates a sealed environment for the image sensor 310 that excludes dust moisture and other contaminants that may damage the image sensor or the quality of the captured images. In the embodiment of FIG. 3, the powered lens element has the advantage of being close to the image sensor without contacting the delicate wire bonds or hindering the wire bonding process.

A temporary protective cover may be placed over the optical system 308 to protect the optical system from damage during assembly. In one application, the rear lens element 320 is covered with a temporary protective cover and attached to the package structure. The package structure with the protected powered lens element is then soldered to a circuit board. After circuit board attachment, the temporary protective cover is removed from the powered lens element, leaving an undamaged lens element. Additional lens elements can then be added to the powered lens element as needed.

In an embodiment, the package structure 302 and the rear lens element 320 include complementary alignment features that cause the lens element to be accurately aligned with the image sensor 310 once the lens element is attached to the package structure. In an embodiment, the alignment features may include mechanical alignment features and/or optical alignment features. Example mechanical alignment features include complementary notches, grooves, flat surfaces, protrusions, etc. integrated into the surfaces of the package structure and the lens element. Example optical alignment features include complementary optically detectable markings or notches integrated into the package structure and the lens element that are utilized to optically align the lens element with the package structure and the image sensor. In an embodiment, alignment features of the package structure prevent the powered lens element form accidentally contacting the image sensor or the wire bonds.

In an embodiment, the package structure 302 may include alignment features that enable the image sensor 310 to be accurately aligned within the package structure during the image sensor packaging process. The alignment features that enable the image sensor to be aligned within the package structure may be different from, or the same as, the alignment features that are utilized to align the lens element with the package structure and image sensor.

Figure 4:
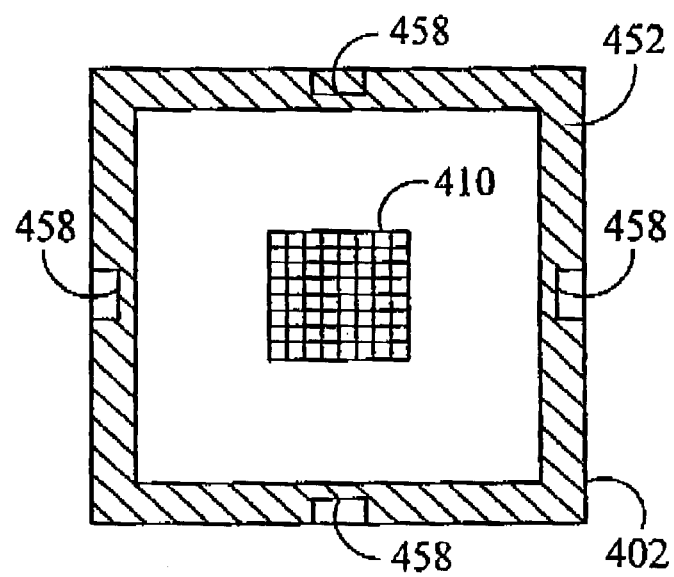
FIG. 4 is a top view of a package structure that includes alignment features for aligning a lens element in accordance with an embodiment of the invention.

FIG. 4 is a top view of a package structure 402 that shows an attachment surface 452 and alignment features 458 relative to an image sensor chip 410. The attachment surface is a flat surface on the package sidewall upon which the rear lens element is attached. The alignment features include four notches in the package sidewall. The four notches are aligned to receive complementary protrusions in the lens element. The alignment notches and complementary protrusions are integrated into the package structure and the lens element such that alignment of the notches and protrusions during the attachment process causes alignment of the powered lens element with the image sensor.

Although gluing is the preferred technique for attaching the powered lens element 320 to the package structure 302, in an alternative embodiment, the package structure and powered lens element may include complementary attachment features that enable the powered lens element to be securely attached to the package structure. For example, the attachment features may include exterior and/or interior features such as clips and/or clip receivers. Alternative attachment features of the package structure and lens element may include, for example, through holes or integrated bolts that enable the lens element to be attached to the package structure. As described above, additional lens elements may be glued directly to the rear lens element to form a composite lens element. Additional elements including lens elements, apertures, filters, and lens hoods may be contained in a support structure, such as a lens barrel, that is stacked on top of the package structure or rear lens element.

Referring back to FIG. 3, the additional powered lens element 324 (the front lens element) is glued to the top surface of the rear lens element 320. In the embodiment of FIG. 3, the additional lens element helps direct and focus light onto the image sensor 310. Adjustable lens elements may be added on top of the powered lens elements 320 and 324. Adjustable lens elements are preferably added after the image sensor package is attached to a printed circuit board to reduce the size of the device for automated handling and to enable the use of molded plastic materials that would be damaged by the high temperatures of printed circuit board assembly.

The lens hood 330 shown in FIG. 3 is an example mechanical device that limits the amount of light that enters the front and/or rear lens elements 320 and 324. In an embodiment, the lens hood is glued to the front and rear lens elements to ensure that only light propagating from the front of the image capture system enters the lens elements.

Figure 5:
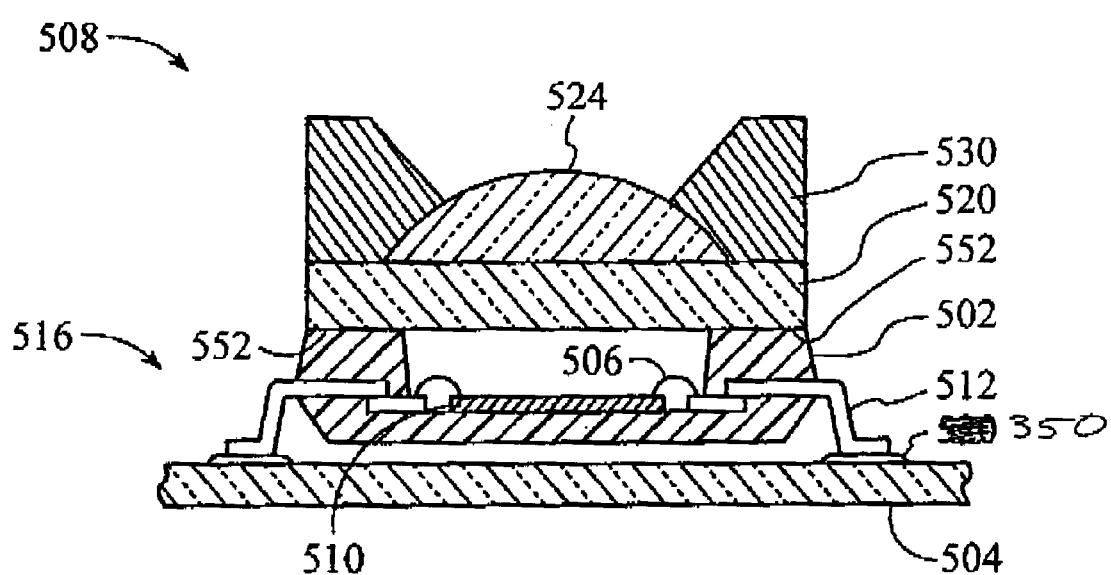
FIG. 5 is a depiction of an image capture system in which an unpowered covered element is attached to the package structure of a surface mounted image sensor package in accordance with an embodiment of the invention.

In an alternative embodiment of the invention, the image sensor is sealed within the package cavity by an unpowered transparent cover element instead of a powered lens element. Referring to FIG. 5, an unpowered transparent cover element 520 is attached to the package structure 502 to create a sealed environment for the image sensor 510. A powered lens element 524 is then glued to the unpowered transparent cover element to create a composite powered lens element. In an embodiment, the powered lens element is glued onto the unpowered transparent cover element after the image sensor package has been soldered to a circuit board.

In another embodiment, the image sensor is sealed within the package cavity by a temporary protective cover that is not necessarily transparent. The temporary protective cover is removed after the image sensor package is soldered to the circuit board and a powered lens element is attached to the package structure as described above with reference to FIG. 3.

In an embodiment of the digital image capture systems of FIGS. 3 and 5, the package structures 302 and 502 include at least three alignment features that are complementary to at least three alignment features of the lens element or cover element.

Preferably, the image sensor packages 316 and 516 and optics systems 308 and 508 are assembled utilizing materials and processes that exclude dust and moisture from damaging the image sensors and the optics systems.

In an embodiment, the image sensor packages and optics systems are assembled to eliminate air gaps between the internal elements of the image sensor package and the rear lens element or cover element. In an embodiment, an index matching fluid is placed between the rear lens element of the optics system and the image sensor to prevent reflections or other image aberrations.

What is claimed is:

1. A digital image capture system comprising:
    an image sensor package; and
    a powered lens element attached to said image sensor package:
        said image sensor package comprising;
            an image sensor;
            a package structure for holding said image sensor, said package structure including a surface that is complementary to a portion of said powered lens element; and
            electrical connectors for creating electrical connections between said image sensor and a circuit board;
        said powered lens element including a surface that is complementary to said surface of said package structure.

2. The digital image capture system of claim 1 wherein said powered lens element and said package structure create a sealed environment for said image sensor.

3. The digital image capture system of claim 1 further including a temporary protective cover attached to said powered lens element to protect said powered lens element.

4. The digital image capture system of claim 1 further including an additional powered lens element attached to said powered lens element to create a composite lens element.

5. The digital image capture system of claim 1 wherein said powered lens element includes opaque surfaces that prevent light from contacting said image sensor except through a light input and a light output.

6. The digital image capture system of claim 1 wherein said powered lens element includes:
    a first surface that is opposite said image sensor; and
    a second surface that is nearest to said image sensor, said second surface including an optically powered portion of said powered lens element.

7. The digital image capture system of claim 1 wherein said package structure includes alignment features for aligning said powered lens element with said image sensor.

8. The digital image capture system of claim 1 wherein said powered lens element includes a light input and a light output that enable desired light to pass through said lens element and contact said image sensor.

9. A digital image capture system comprising:
an image sensor package;
an unpowered transparent cover element attached to said image sensor package; and
a powered lens element attached to said unpowered transparent cover element to create a composite lens element;
said image sensor package comprising;
an image sensor;
a package structure for holding said image sensor, said package structure including a surface that is complementary to a portion of said unpowered transparent cover element; and
electrical connectors for creating electrical connections between said image sensor and a circuit board;
said unpowered transparent cover element including a surface that is complementary to said surface of said package structure.

10. The digital image capture system of claim 9 wherein said unpowered transparent cover element and said package structure create a sealed environment for said image sensor.

11. The digital image capture system of claim 9 further including a temporary protective cover attached to said composite lens element to protect said composite lens element.

12. The digital image capture system of claim 9 wherein said composite lens element includes a light input and a light output that enable desired light to pass through said lens element and contact said image sensor.

13. The digital image capture system of claim 9 wherein said composite lens element includes opaque surfaces that prevent light from contacting said image sensor except through a light input and a light output.

14. The digital image capture system of claim 9 wherein said package structure includes alignment features for aligning said powered lens element with said image sensor.

15. A digital image capture system comprising:
an image sensor:
a package structure for holding said image sensor, said package structure including a surface that is complementary to a surface of a temporary protective cover and a surface of a powered lens element; and
electrical connectors for creating electrical connections between said image sensor and a circuit board.

16. The digital image capture system of claim 15 wherein said temporary protective cover is attached to said package structure before said electrical connectors are attached to said circuit board and then replaced by said powered lens element after said electrical connectors are attached to said circuit board.

17. The digital image capture system of claim 16 wherein said temporary protective cover and said package structure create a sealed environment for said image sensor.

18. The digital image capture system of claim 15 wherein said powered lens element is attached to said package structure.

19. The digital image capture system of claim 18 wherein said powered lens element and said package structure create a sealed environment for said image sensor.

20. The digital image capture system of claim 19 wherein said powered lens element includes an opaque surface that prevents unwanted light from contacting said image sensor.

* * * * *